(12) United States Patent
Obata

(10) Patent No.: US 12,133,326 B2
(45) Date of Patent: Oct. 29, 2024

(54) EXTENSIBLE AND CONTRACTIBLE WIRING BOARD AND METHOD FOR MANUFACTURING EXTENSIBLE AND CONTRACTIBLE WIRING BOARD

(71) Applicant: Murata Manufacturing Co., Ltd., Nagaokakyo (JP)

(72) Inventor: Takayoshi Obata, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/459,989

(22) Filed: Sep. 1, 2023

(65) Prior Publication Data

US 2023/0413428 A1 Dec. 21, 2023

Related U.S. Application Data

(60) Division of application No. 17/318,150, filed on May 12, 2021, now Pat. No. 11,785,714, which is a
(Continued)

(30) Foreign Application Priority Data

Nov. 22, 2018 (JP) ................. 2018-219247

(51) Int. Cl.
*H05K 1/02* (2006.01)
*A61L 27/44* (2006.01)
(Continued)

(52) U.S. Cl.
CPC ............ *H05K 1/0283* (2013.01); *H05K 3/20* (2013.01); *H05K 3/4611* (2013.01)

(58) Field of Classification Search
CPC ........ H05K 1/02; H05K 1/023; H05K 1/0283; H05K 1/03; H05K 1/20142; H05K 1/144;
(Continued)

(56) References Cited

U.S. PATENT DOCUMENTS 3,576,387 A 4/1971 Derby
3,994,726 A 11/1976 Wales
(Continued)

FOREIGN PATENT DOCUMENTS

JP S62252495 A 11/1987
JP H0719340 U 4/1995
(Continued)

OTHER PUBLICATIONS

Araki et al., "Electrical resistivity of stretchable wiring comprising silver fillers under cyclic tensile strain," Proceedings of JIEP Annual Meeting, vol. 26, 9D-05, 2012, pp. 322-325. (listed in ISR and WO).
(Continued)

*Primary Examiner* — Xiaoliang Chen
(74) *Attorney, Agent, or Firm* — ArentFox Schiff LLP

(57) ABSTRACT

An extensible and contractible wiring board that includes an extensible and contractible wiring sheet having an extensible and contractible resin sheet and an extensible and contractible wiring on the extensible and contractible resin sheet, the extensible and contractible wiring including a conductive particle, a resin, and a void at an interface between the conductive particle and the resin; and a fixing sheet on a main surface of the extensible and contractible wiring sheet.

8 Claims, 8 Drawing Sheets

Related U.S. Application Data continuation of application No. PCT/JP2019/022942, filed on Jun. 10, 2019.

(51) Int. Cl.
*A61L 27/60* (2006.01)
*B32B 5/00* (2006.01)
*B32B 5/12* (2006.01)
*B32B 5/14* (2006.01)
*H01B 11/18* (2006.01)
*H01L 41/16* (2006.01)
*H01L 41/18* (2006.01)
*H05K 1/03* (2006.01)
*H05K 3/00* (2006.01)
*H05K 3/20* (2006.01)
*H05K 3/46* (2006.01)

(58) Field of Classification Search
CPC .......... H05K 1/183; H05K 1/189; H05K 3/00; H05K 3/285; H05K 3/361; H05K 3/3485; H01B 11/18; H01B 11/203; A61L 27/44; A61L 27/60; B32B 5/00; B32B 5/12; B32B 5/14; H01L 41/16; H01L 41/18; H01L 41/094; H01L 41/098; H01L 41/0986
USPC ........ 156/163, 221, 313, 719; 174/103, 250, 174/254, 259, 388; 252/512, 513, 514; 310/311, 330, 800
See application file for complete search history.

(56) References Cited

U.S. PATENT DOCUMENTS

| | | | |
|---|---|---|---|
| 4,002,476 A | 1/1977 | Wales | |
| 4,734,320 A | 3/1988 | Ohira et al. | |
| 4,745,301 A * | 5/1988 | Michalchik | H01B 1/24 252/511 |
| 4,874,549 A * | 10/1989 | Michalchik | H01C 10/106 252/502 |
| 5,060,527 A * | 10/1991 | Burgess | G01L 5/228 73/862.68 |
| 5,695,859 A * | 12/1997 | Burgess | H01H 3/141 428/209 |
| 6,972,966 B1 | 12/2005 | Oishi et al. | |
| 2004/0102125 A1 * | 5/2004 | Morman | A61F 13/4902 442/195 |
| 2005/0014883 A1 | 1/2005 | Blankenship et al. | |
| 2005/0046313 A1 * | 3/2005 | Basheer | H10N 30/857 310/800 |
| 2008/0045917 A1 * | 2/2008 | Autran | A61F 13/5148 604/385.29 |
| 2008/0283284 A1 | 11/2008 | Koyama et al. | |
| 2008/0284046 A1 | 11/2008 | Karashima et al. | |
| 2009/0078746 A1 | 3/2009 | Karashima et al. | |
| 2009/0229120 A1 | 9/2009 | Taniguchi et al. | |
| 2009/0297799 A1 | 12/2009 | Nakasone et al. | |
| 2010/0025100 A1 | 2/2010 | Hamano et al. | |
| 2010/0171393 A1 | 7/2010 | Pei et al. | |
| 2013/0056249 A1 * | 3/2013 | Taguchi | H10N 30/878 174/254 |
| 2013/0341063 A1 | 12/2013 | Gundel | |
| 2014/0124257 A1 * | 5/2014 | Yoshihara | H05K 1/02 174/254 |
| 2014/0260653 A1 | 9/2014 | Merrell et al. | |
| 2015/0034237 A1 * | 2/2015 | Biggs | B05D 1/265 156/719 |
| 2015/0309073 A1 | 10/2015 | Mirkin et al. | |
| 2015/0368804 A1 | 12/2015 | Lee et al. | |
| 2016/0286972 A1 | 10/2016 | DeFranks et al. | |
| 2017/0086291 A1 * | 3/2017 | Cotton | H01L 31/03926 |
| 2018/0233252 A1 | 8/2018 | Esseghir et al. | |
| 2018/0240570 A1 | 8/2018 | Esseghir et al. | |
| 2018/0254126 A1 | 9/2018 | Esseghir et al. | |
| 2018/0294067 A1 | 10/2018 | Bains et al. | |
| 2020/0101202 A1 | 4/2020 | Ashrafi et al. | |
| 2020/0141978 A1 | 5/2020 | Ishimatsu et al. | |
| 2020/0396832 A1 * | 12/2020 | Yamashita | H05K 1/0283 |

FOREIGN PATENT DOCUMENTS

| | | |
|---|---|---|
| JP | H07138152 A | 5/1995 |
| JP | 2013131554 A | 7/2013 |
| JP | 2016145725 A | 8/2016 |
| JP | 2017038722 A | 2/2017 |
| JP | 2017068169 A | 4/2017 |

OTHER PUBLICATIONS

Araki et al., "Printable and Stretchable Conductive Wirings Comprising Silver Flakes and Elastomers," IEEE Electron Device Letters, vol. 32, No. 10, Oct. 2011, pp. 1424-1426.

International Search Report issued in PCT/JP2019/022942, date of mailing Aug. 27, 2019.

Written Opinion of the International Searching Authority issued for PCT/JP2019/022942, date of mailing Aug. 27, 2019.

* cited by examiner

EXTENSIBLE AND CONTRACTIBLE WIRING BOARD AND METHOD FOR MANUFACTURING EXTENSIBLE AND CONTRACTIBLE WIRING BOARD

CROSS REFERENCE TO RELATED APPLICATIONS

The present application is a divisional of application Ser. No. 17/318,150, filed May 12, 2021, which is a continuation of International application No. PCT/JP2019/022942, filed Jun. 10, 2019, which claims priority to Japanese Patent Application No. 2018-219247, filed Nov. 22, 2018, the entire contents of each of which are incorporated herein by reference.

FIELD OF THE INVENTION

The present invention relates to an extensible and contractible wiring board and a method for manufacturing an extensible and contractible wiring board.

BACKGROUND OF THE INVENTION

In recent years, a state of a human body and the like have been managed by acquiring and analyzing biological information.

For example, an extensible and contractible wiring board in which an extensible and contractible substrate is attached to a living body and used has been known as described in Patent Document 1.

Patent Document 1: Japanese Patent Application Laid-Open No. 2016-145725

SUMMARY OF THE INVENTION

The extensible and contractible wiring board illustrated in Patent Document 1 includes an extension and contraction sensing portion containing a conductive fiber and a resin binder. This portion extends and contracts, and thus, electrical characteristics change. Accordingly, the extensible and contractible wiring board has been used as distortion sensor that senses distortion (extension and contraction).

However, in such an extensible and contractible wiring board, a phenomenon called a zero-drift in which a reference point of a resistance value changes whenever the expansion and contraction are repeated is easy to occur, and there is a problem that a slope of a change in the resistance value change, which is an index of sensor sensitivity, is small.

The present invention has been made to solve the above problems, and an object of the present invention is to provide an extensible and contractible wiring board in which is hard to cause zero-drift and which has high sensitivity.

An extensible and contractible wiring board of the present invention includes an extensible and contractible wiring sheet having an extensible and contractible resin sheet and an extensible and contractible wiring on the extensible and contractible resin sheet, the extensible and contractible wiring including a conductive particle, a resin, and a void at an interface between the conductive particle and the resin; and a fixing sheet on a main surface of the extensible and contractible wiring sheet.

A method for manufacturing an extensible and contractible wiring board of the present invention includes: applying a first tensile stress to an extensible and contractible wiring sheet that includes an extensible and contractible resin sheet and an extensible and contractible wiring formed on the extensible and contractible resin sheet; relaxing the first tensile stress; applying a second tensile stress to the extensible and contractible wiring sheet after relaxing the first tensile stress; and securing a fixing sheet to a main surface of the extensible and contractible wiring sheet in a state in which the second tensile stress is applied.

According to the present invention, it is possible to provide an extensible and contractible wiring board that is hard to cause zero-drift and has high sensitivity.

DETAILED DESCRIPTION OF THE INVENTION

Hereinafter, an extensible and contractible wiring board of the present invention and a method for manufacturing an extensible and contractible wiring board will be described.

However, the present invention is not limited to the following configurations, and can be appropriately changed and applied without departing from the gist of the invention. Note that a combination of two or more individual preferred configurations of the present invention to be described below is also the present invention.

Needless to say, the embodiments to be illustrated below are examples, and partial configurations illustrated in different embodiments can be replaced or combined. In second and subsequent embodiments, matters common to a first embodiment will not be described, and only different points will be described. In particular, similar actions and effects due to similar configurations will not be mentioned sequentially for each embodiment.

In the following description, when the embodiments are not particularly distinguished, the extensible and contractible wiring board of each embodiment is simply referred to as the "extensible and contractible wiring board of the present invention".

First, the extensible and contractible wiring board of the present invention will be described.

First Embodiment

In the extensible and contractible wiring board of the present invention, an example in which a fixing sheet is provided on one main surface of an extensible and contractible wiring sheet will be described as a first embodiment of the extensible and contractible wiring board of the present invention.

Figure 1:
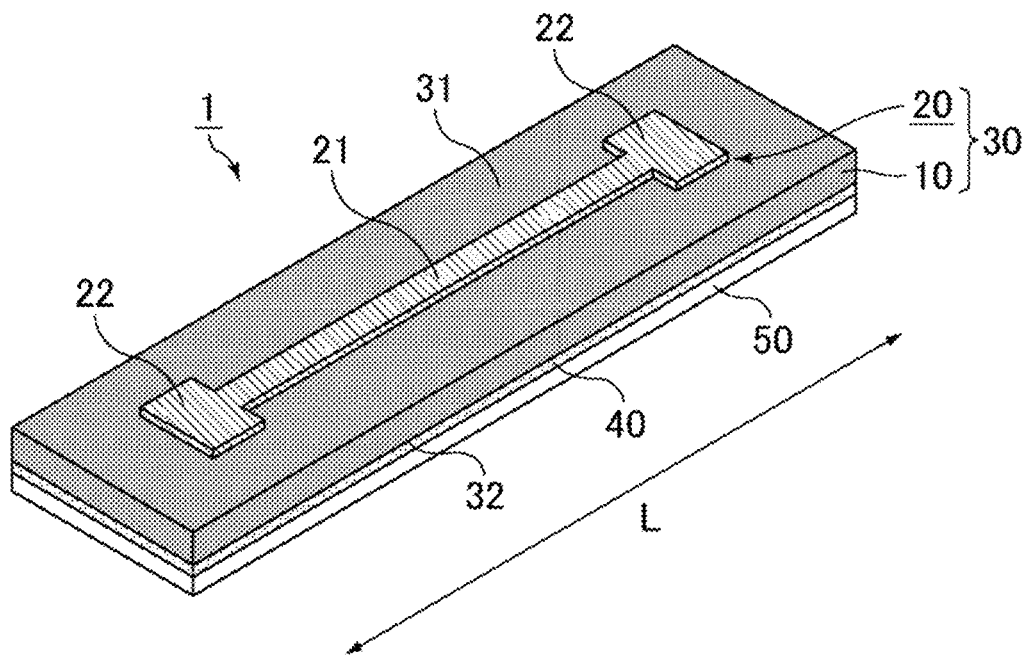
FIG. 1 is a perspective view schematically illustrating an extensible and contractible wiring board according to a first embodiment of the present invention.

FIG. 1 is a perspective view schematically illustrating the extensible and contractible wiring board according to the first embodiment of the present invention.

An extensible and contractible wiring board 1 illustrated in FIG. 1 includes an extensible and contractible wiring sheet 30 that includes an extensible and contractible resin sheet 10 and an extensible and contractible wiring 20 on the extensible and contractible resin sheet 10.

The extensible and contractible wiring sheet 30 is a portion that is actually attached to a living body at the time of use and serves as a board and a wiring that functions as a sensor.

Of a main surface 31 and a main surface 32 which are two main surfaces of the extensible and contractible wiring sheet 30, an adhesive layer 40 is provided on the main surface 32 on a side on which the extensible and contractible wiring 20 is not provided, and a fixing sheet 50 is further provided on the adhesive layer 40.

The extensible and contractible resin sheet 10 is made of, for example, an extensible and contractible resin material. Examples of the resin material include thermoplastic polyurethane and the like.

A thickness of the extensible and contractible resin sheet 10 is not particularly limited, but is preferably 100 μm or less, and more preferably 1 μm or less from the viewpoint of not inhibiting the expansion and contraction of a front surface of the living body when attached to the living body.

FIG. 1 illustrates a dumbbell type electrode in which electrodes 22 are provided at both ends of a wiring 21 as an example of a shape of the extensible and contractible wiring 20. Shapes of the wiring and the electrodes are not particularly limited, and can be arbitrarily changed depending on a location and an application of use.

The extensible and contractible wiring 20 is fixed by the fixing sheet 50 in a state in which tensile stress is applied in a direction indicated by a left right arrow L in FIG. 1.

The extensible and contractible wiring has conductive particles and a resin as will be described later, and is a wiring having extensibility and contractibility. For example, a mixture of a metal powder such as Ag, Cu, or Ni as conductive particles and an elastomer-based resin such as a silicone resin can be used.

An average particle size of the conductive particles is not particularly limited, but is preferably 0.01 μm to 10 μm. A shape of the conductive particles is preferably spherical.

A thickness of the extensible and contractible wiring is not particularly limited, but is preferably 1 μm to 100 μm, and more preferably 1 μm to 50 μm.

The details of the extensible and contractible wiring in a state in which the tensile stress is applied will be described.

Figure 2:
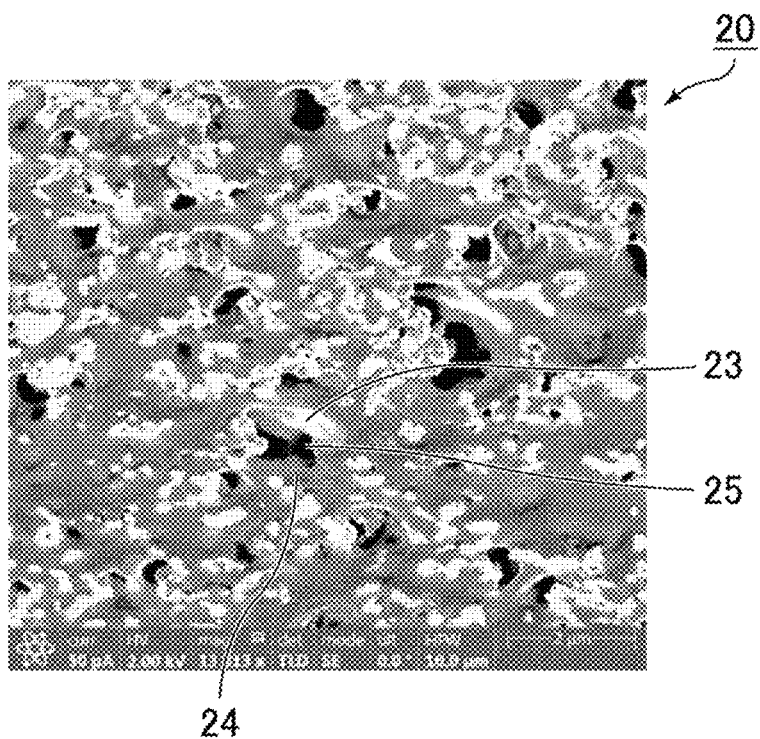
FIG. 2 is an electron micrograph of an extensible and contractible wiring in a state in which tensile stress is applied.
Figure 3:
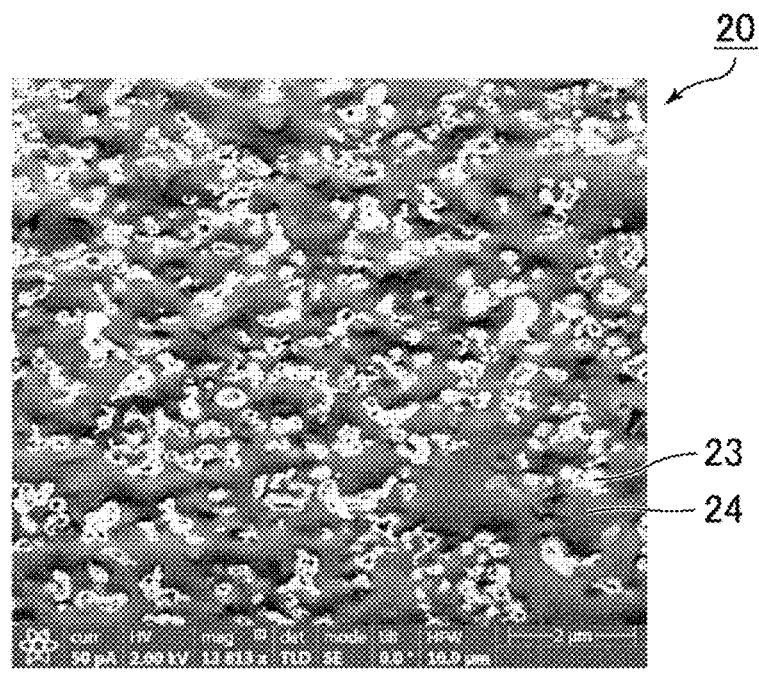
FIG. 3 is an electron micrograph of the extensible and contractible wiring in a state in which the tensile stress is not applied.

FIG. 2 is an electron micrograph of the extensible and contractible wiring in a state in which the tensile stress is applied, and FIG. 3 is an electron micrograph of the extensible and contractible wiring in a state in which the tensile stress is not applied.

FIG. 2 illustrates conductive particles 23 and a resin 24 forming the extensible and contractible wiring 20, and further illustrates voids 25 at an interface between the conductive particles 23 and the resin 24.

On the other hand, although there are the conductive particles 23 and the resin 24 forming the extensible and contractible wiring 20 in FIG. 3, there are no voids at the interface between the conductive particles 23 and the resin 24.

Thus, it can be seen that there are the voids in the extensible and contractible wiring when the tensile stress is applied to the extensible and contractible wiring. Since the voids are formed by the separation of the conductive particles, there are the voids at the interface between the conductive particles and the resin.

In examples to be described later, effects of the extensible and contractible wiring board in a state in which the tensile stress is applied to the extensible and contractible wiring will be shown, but when the extensible and contractible wiring board is in a state in which the tensile stress is applied to the extensible and contractible wiring, there are the voids at the interface between the conductive particles and the resin forming the extensible and contractible wiring. When there are such voids in the extensible and contractible wiring, the extensible and contractible wiring has a porous (sponge-lie) structure due to the presence of the voids, and it is presumed that the elasticity of the extensible and contractible wiring increases. Zero-drift is hard to occur due to the presence of such voids in the extensible and contractible wiring, and thus, the sensitivity of the extensible and contractible wiring board is improved.

As the state of the voids present in the extensible and contractible wiring, it is preferable that fine voids are scattered throughout. It is preferable that a size of the voids is substantially the same as a size of the conductive particles.

The strength of the tensile stress applied to the extensible and contractible wiring in a state in which the extensible and contractible wiring is fixed by the fixing sheet can be obtained by expressing, as an index, ductility which is a length of the extensible and contractible wiring with respect to a length of the extensible and contractible wiring when the tensile stress is not applied. The ductility is not particularly limited and may be determined by a material system of the extensible and contractible wiring, but is preferably 300% to 800%.

The length of the extensible and contractible wiring is a total length of the wiring 21 and the two electrodes 22 in FIG. 1 in the direction indicated by the left right arrow L.

Of the two main surfaces of the extensible and contractible wiring sheet 30, the adhesive layer 40 is a layer provided on the main surface 32 on the side on which the extensible and contractible wiring 20 is not provided. The adhesive layer 40 is provided, and thus, the extensible and contractible wiring sheet 30 of the extensible and contractible wiring board 1 can be attached to a living body.

A material of the adhesive layer 40 is not particularly limited, and examples thereof include adhesive resins such as acrylic polymers and urethane resins. A thickness of the adhesive layer 40 is not particularly limited, but is preferably 0.1 µm to 10 µm, and more preferably 0.1 µm to 1 µm.

The fixing sheet 50 is a sheet provided on the adhesive layer 40, and is a sheet for fixing the extensible and contractible wiring in a state in which the tensile stress is applied. Thus, the fixing sheet 50 needs to have a strength so as not to be deformed due to tensile stress.

As the fixing sheet 50, a flexible film having low extensibility and contractibility such as a PET film, a polystyrene film, a polypropylene film, or a polyimide film can be used.

The PET film is preferable since the PET film is hard, can be coped with roll-to-roll molding, and is inexpensive.

When the PET film is used as the fixing sheet 50, a thickness is preferably 200 µm or more in order to have sufficient strength to fix the extensible and contractible wiring.

Since the fixing sheet 50 is a sheet that is peeled off at the time of use of the extensible and contractible wiring board, it is preferable that the fixing sheet is a sheet having good peel properties and having good release properties from the adhesive layer 40.

Second Embodiment

In the extensible and contractible wiring board of the present invention, an example in which the fixing sheets are provided on both the main surfaces of the extensible and contractible wiring sheet will be described as a second embodiment of the extensible and contractible wiring board of the present invention.

Figure 4:
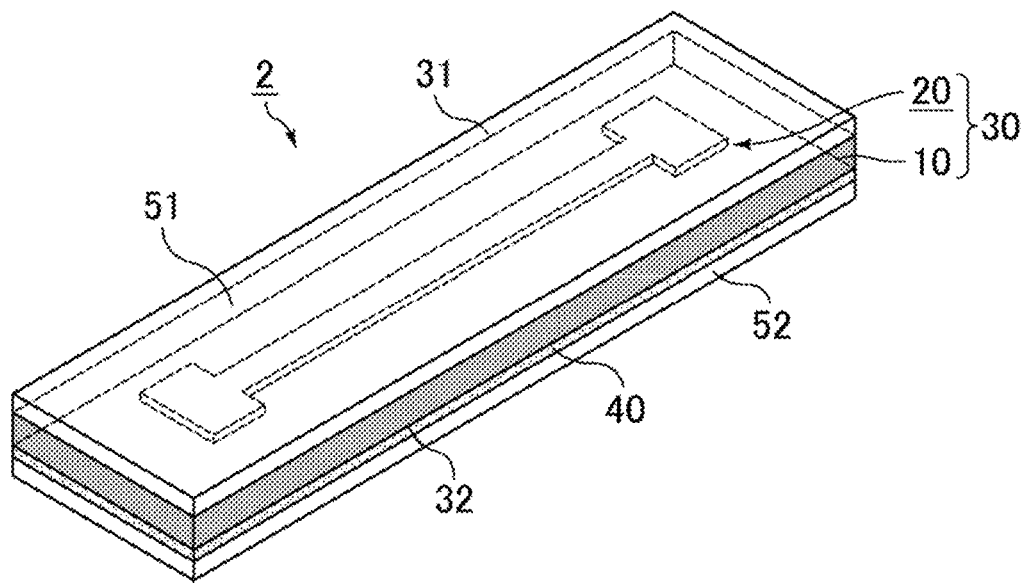
FIG. 4 is a perspective view schematically illustrating an extensible and contractible wiring board according to a second embodiment of the present invention.

FIG. 4 is a perspective view schematically illustrating the extensible and contractible wiring board according to the second embodiment of the present invention.

An extensible and contractible wiring board 2 illustrated in FIG. 4 has a configuration in which a fixing sheet is also provided on the main surface 31 (main surface on a side on which the extensible and contractible wiring 20 is provided) of the extensible and contractible wiring sheet 30 in the extensible and contractible wiring board 1 illustrated in FIG. 1.

The fixing sheet provided on the main surface 31 of the extensible and contractible wiring sheet 30 is a fixing sheet 51 and the fixing sheet provided on the main surface 32 is a fixing sheet 52.

The fixing sheet 51 and the fixing sheet 52 may be the same fixing sheet or different fixing sheets.

The adhesive layer is not provided between the main surface 31 of the extensible and contractible wiring sheet 30 and the fixing sheet 51.

The fixing sheets are preferably provided on both the main surfaces of the extensible and contractible wiring sheet in the extensible and contractible wiring board from the viewpoint of work efficiency when the extensible and contractible wiring sheet is attached to the living body.

When the extensible and contractible wiring board 2 illustrated in FIG. 4 is used, the fixing sheet 52 is peeled off immediately before attaching to the living body, and the adhesive layer 40 is exposed. The main surface 32 side of the extensible and contractible wiring sheet 30 is attached to the living body by an adhesive force of the adhesive layer 40. At this point, a state in which the tensile stress is applied to the extensible and contractible wiring 20 is maintained by the fixing sheet 51. The fixing sheet 51 is peeled off after the extensible and contractible wiring sheet is attached to the living body, and thus, it is possible to complete the attachment of the extensible and contractible wiring sheet 30 in a state in which the tensile stress is applied to the extensible and contractible wiring 20.

Third Embodiment

In the extensible and contractible wiring board of the present invention, an example in which the fixing sheets provided on the main surface of the extensible and contractible resin sheet on the side on which the extensible and contractible wiring is not provided include a first fixing sheet having slits and a second fixing sheet on the first fixing sheet will be described as a third embodiment of the present invention.

Figure 5:
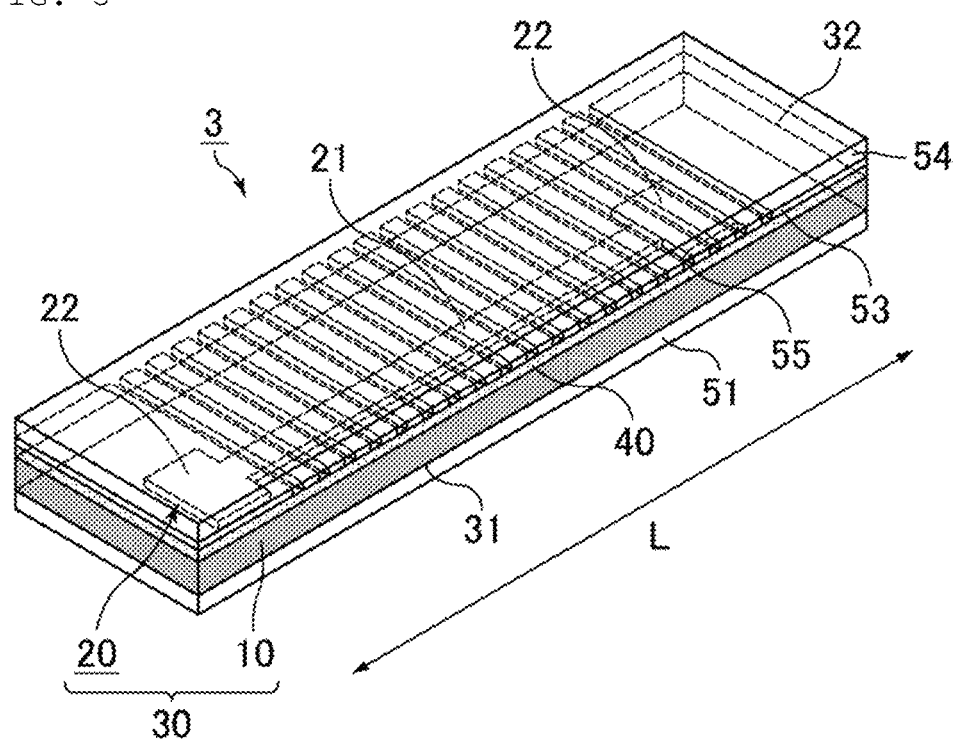
FIG. 5 is a perspective view schematically illustrating an extensible and contractible wiring board according to a third embodiment of the present invention.

FIG. 5 is a perspective view schematically illustrating the extensible and contractible wiring board according to the third embodiment of the present invention.

An extensible and contractible wiring board 3 illustrated in FIG. 5 is different from the extensible and contractible wiring board 2 illustrated in FIG. 4 in a configuration of the fixing sheet on the main surface 32 (main surface on the side on which the extensible and contractible wiring is not provided) side of the extensible and contractible wiring sheet 30.

The extensible and contractible wiring board 3 illustrated in FIG. 5 is illustrated upside down from the extensible and contractible wiring board 2 illustrated in FIG. 4, and the main surface 32 side of the extensible and contractible wiring sheet 30 faces up and the main surface 31 side faces down.

The fixing sheets on the main surface 32 side of the extensible and contractible wiring sheet 30 include a first fixing sheet 53 provided on the adhesive layer 40 and a second fixing sheet 54 provided on a first fixing sheet 53.

The first fixing sheet 53 has slits 55 in a direction transverse to a direction of the tensile stress applied to the extensible and contractible wiring 20 (direction indicated by a left right arrow L in FIG. 5).

The fact that the direction of the slits is transverse with respect to the direction of the tensile stress applied to the extensible and contractible wiring means that the direction of the tensile stress and the direction of the slits are not parallel.

An angle formed by the direction of the tensile stress applied to the extensible and contractible wiring and the direction of the slits is preferably 90°.

Such an extensible and contractible wiring board is suitable for fixing the extensible and contractible wiring with the fixing sheets in a state in which the tensile stress is applied in a manufacturing step.

The fixing sheets are preferably provided on both the main surfaces of the extensible and contractible wiring sheet from the viewpoint of work efficiency when the extensible and contractible wiring sheet is attached to the living body as described for the extensible and contractible wiring board of the second embodiment.

The extensible and contractible wiring board of the present invention can be used as a sensor for acquiring and analyzing biological information by attaching the extensible and contractible wiring sheet to the living body in a state in which the tensile stress is applied to the extensible and contractible wiring. The extensible and contractible wiring in a state in which the tensile stress is applied includes the conductive particles, the resin, and the voids present at the interface between the conductive particles and the resin. The sensor including such extensible and contractible wiring is hard to cause zero-drift. The sensitivity of the sensor is improved.

Hereinafter, the method for manufacturing the extensible and contractible wiring board of the present invention will be described.

Figure 6A:
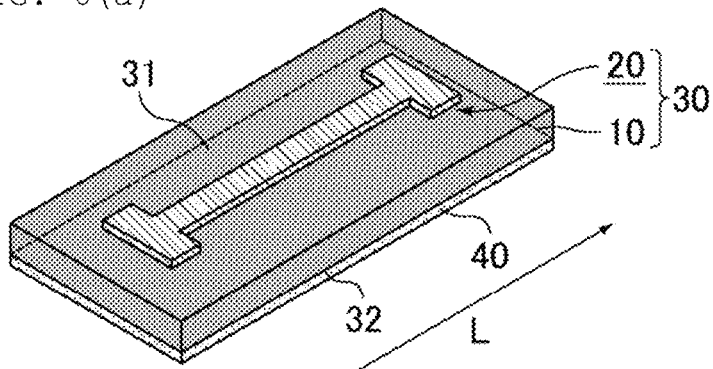
FIG. 6($a$) is a perspective view schematically illustrating an extensible and contractible wiring sheet to which the tensile stress is not applied, FIG. 6($b$) is a perspective view schematically illustrating the extensible and contractible wiring sheet to which the tensile stress is applied, and FIG. 6($c$) is a perspective view schematically illustrating a state in which a state in which the tensile stress is applied to the extensible and contractible wiring is fixed by providing a fixing sheet.
Figure 6B:
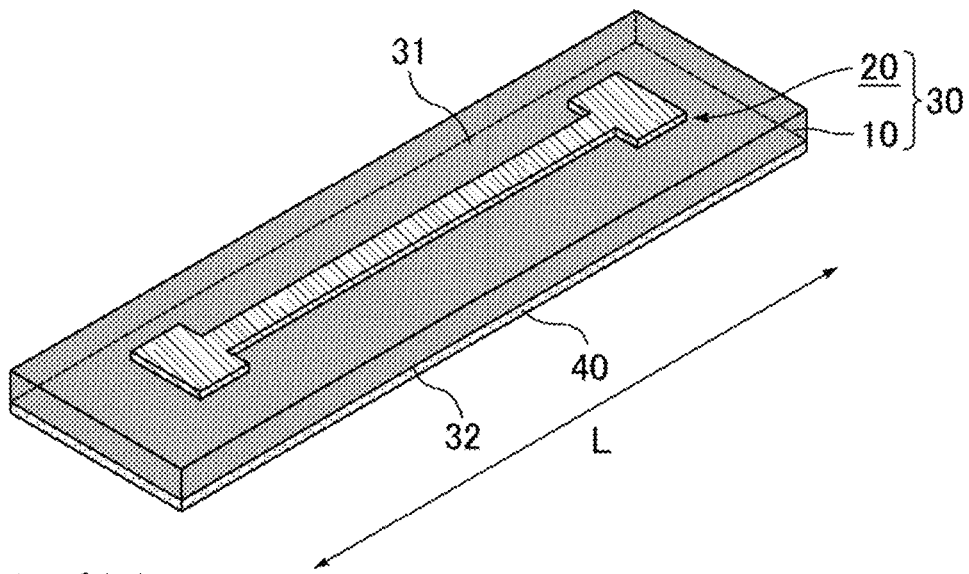
Figure 6C:
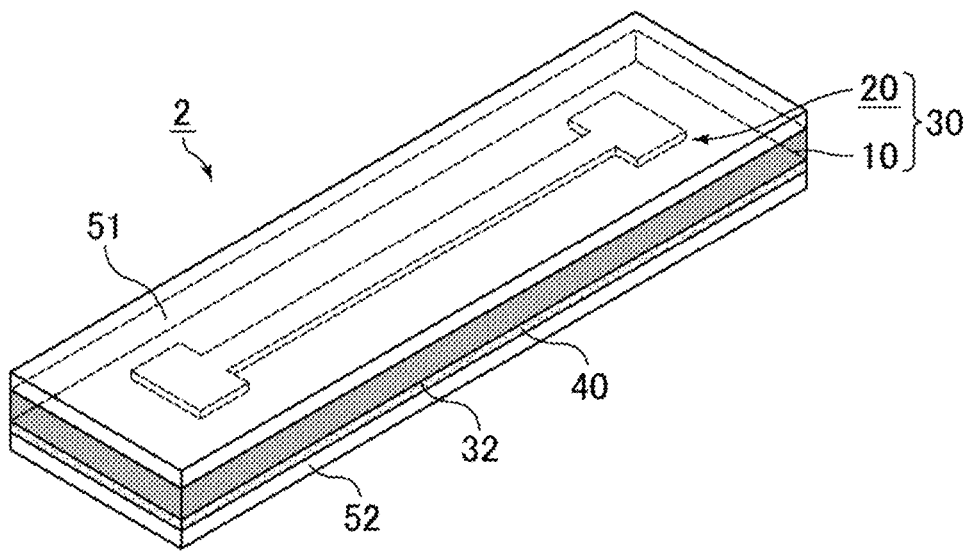

FIG. 6(a) is a perspective view schematically illustrating the extensible and contractible wiring sheet to which the tensile stress is not applied, FIG. 6(b) is a perspective view schematically illustrating the extensible and contractible wiring sheet to which the tensile stress is applied, and FIG. 6(c) is a perspective view schematically illustrating a state in which the tensile stress is applied to the extensible and contractible wiring and is fixed by providing the fixing sheets.

(Extensible and Contractible Wiring Sheet Preparation Step)

The extensible and contractible wiring sheet including the extensible and contractible resin sheet and the extensible and contractible wiring formed on the extensible and contractible resin sheet is prepared.

FIG. 6(a) illustrates the extensible and contractible wiring sheet 30 to which the tensile stress is not applied. The adhesive layer 40 is provided on one main surface 32 of the extensible and contractible wiring sheet 30, but the adhesive layer may or may not be provided at this stage.

(First Extension Step)

In a first extension step, the tensile stress is applied to the extensible and contractible wiring sheet.

FIG. 6(b) illustrates a state in which the tensile stress is applied to the extensible and contractible wiring sheet 30 illustrated in FIG. 6(a) in a direction indicated by a left right arrow L.

By this first extension step, the voids are formed at the interface between the conductive particles and the resin forming the extensible and contractible wiring.

(Relaxation Step)

In a relaxation step, the tensile stress applied in the first extension step is relaxed. The state illustrated in the drawing is the same as the state of the extensible and contractible wiring sheet 30 to which the tensile stress is not applied as illustrated in FIG. 6(a).

(Second Extension Step)

In a second extension step, the tensile stress is applied to the extensible and contractible wiring sheet again.

The state illustrated in the drawing is the same as the state of the extensible and contractible wiring sheet 30 to which the tensile stress is applied as illustrated in FIG. 6(b).

(Fixing Step)

In a fixing step, the fixing sheets are provided on the main surfaces of the extensible and contractible wiring sheet in a state in which the tensile stress applied in the second extension step is applied to the extensible and contractible wiring.

FIG. 6(c) illustrates a state in which the fixing sheet 51 is provided on the main surface 31 of the extensible and contractible wiring sheet 30 and the fixing sheet 52 is provided on the main surface 32 with the adhesive layer 40 interposed therebetween.

The fixing sheet 51 and the fixing sheet 52 are provided, and thus, a state in which the tensile stress applied in the second extension step is applied to the extensible and contractible wiring 20 is fixed.

A thin adhesive layer (not illustrated) is provided at the fixing sheet 51, and the fixing sheet 51 is fixed to the main surface 31 of the extensible and contractible wiring sheet 30. Since this adhesive layer strongly adheres to the fixing sheet 51 side and remains on the fixing sheet 51 side when the fixing sheet 51 is peeled off at the time of use of the extensible and contractible wiring board, this adhesive layer does not remain on a front surface of the extensible and contractible wiring sheet 30.

The extensible and contractible wiring board obtained in this manner is the same as the extensible and contractible wiring board 2 illustrated in FIG. 4.

FIG. 6(c) illustrates a form in which the fixing sheets are provided on both the main surface 31 and the main surface 32 of the extensible and contractible wiring sheet 30, but the fixing sheet may be provided only on one of the main surfaces.

In the above steps, a tension rate and ductility in the first extension step and the second extension step are not particularly limited, and can be changed depending on the material system of the extensible and contractible wiring.

Next, another embodiment of the method for manufacturing the extensible and contractible wiring board of the present invention will be described.

In this embodiment, the extensible and contractible wiring board 3 illustrated in FIG. 5 in which the fixing sheets provided on the main surface of the extensible and contractible resin sheet on the side on which the extensible and contractible wiring is not provided include the first fixing sheet having the slits and the second fixing sheet provided on the first fixing sheet is manufactured.

Figure 7A:
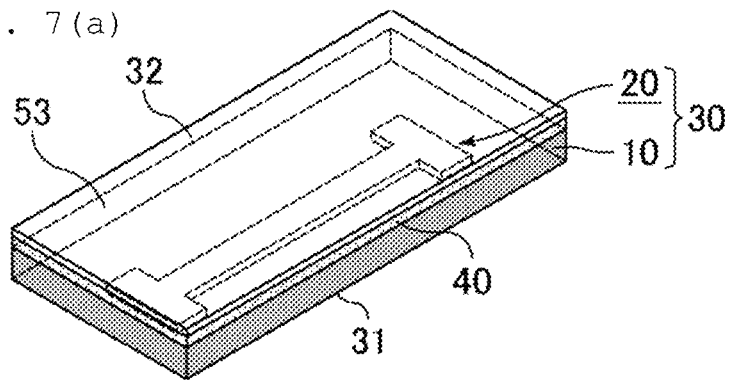
FIG. 7($a$) is a perspective view schematically illustrating a state in which an adhesive layer is provided on a main surface of the extensible and contractible resin sheet on a side on which the extensible and contractible wiring is not provided and a first fixing sheet is further provided on the adhesive layer, FIG. 7($b$) is a perspective view schematically illustrating a state in which slits are formed in the first fixing sheet, FIG. 7($c$) is a perspective view schematically illustrating a state in which the tensile stress is applied to the extensible and contractible wiring sheet and the first fixing sheet, and FIG. 7($d$) is a perspective view schematically illustrating a state in which a state in which the tensile stress is applied to the extensible and contractible wiring is fixed by providing a second fixing sheet on the first fixing sheet.
Figure 7B:
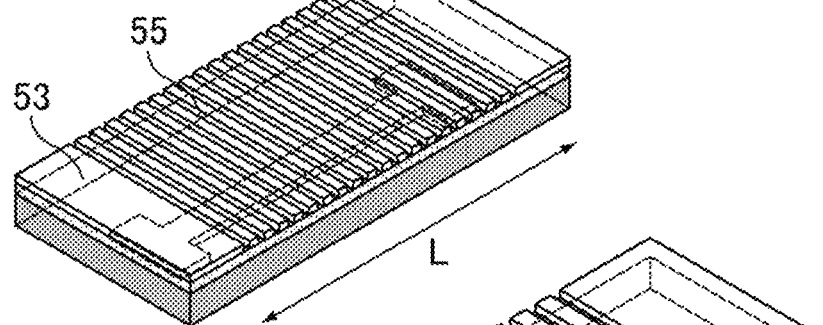
Figure 7C:
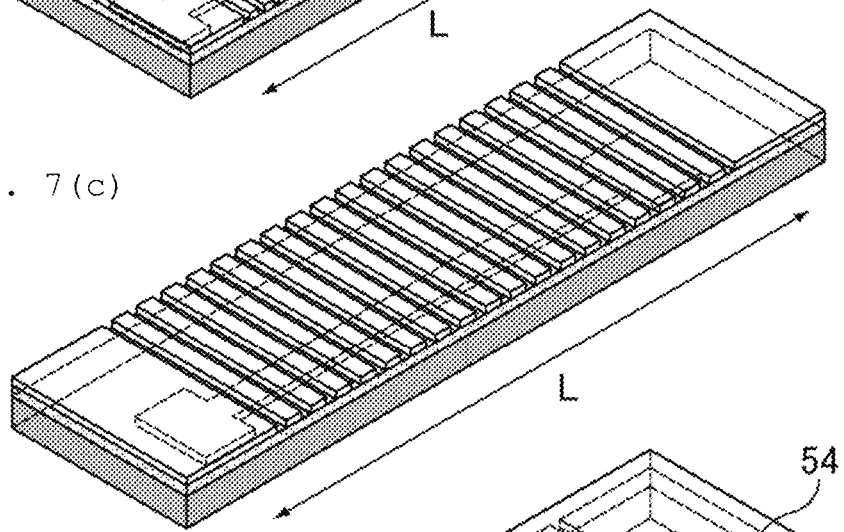
Figure 7D:
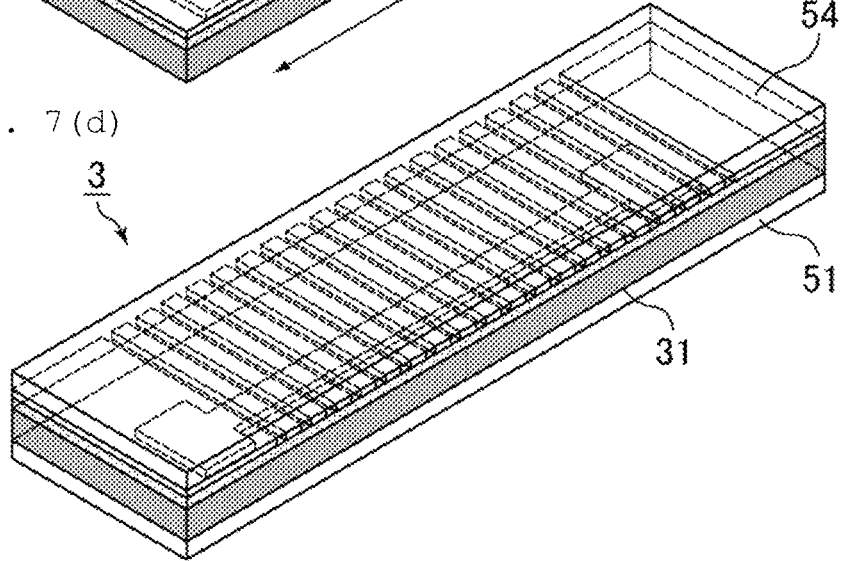

FIG. 7(a) is a perspective view schematically illustrating a state in which the adhesive layer is provided on the main surface of the extensible and contractible resin sheet on the side on which the extensible and contractible wiring is not provided and the first fixing sheet is further provided on the adhesive layer, FIG. 7(b) is a perspective view schematically illustrating a state in which the slits are formed in the first fixing sheet, FIG. 7(c) is a perspective view schematically illustrating a state in which the tensile stress is applied to the extensible and contractible wiring sheet and the first fixing sheet, and FIG. 7(d) is a perspective view schematically illustrating a state in which a state in which the tensile stress is applied to the extensible and contractible wiring is fixed by providing the second fixing sheet on the first fixing sheet.

(First Fixing Sheet Forming Step)

In a first fixing sheet forming step, after the extensible and contractible wiring sheet preparation step, the adhesive layer is provided on the main surface of the extensible and contractible resin sheet on the side on which the extensible and contractible wiring is not provided and the first fixing sheet is further provided on the adhesive layer.

In FIG. 7(a), a state in which the adhesive layer 40 is provided on one main surface 31 of the extensible and contractible wiring sheet 30 on the side on which the extensible and contractible wiring is not provided and the first fixing sheet 53 is further provided on the adhesive layer 40 illustrated. The tensile stress is not applied at this point.

(Slit Forming Step)

In a slit forming step, the slits are formed in the first fixing sheet in a direction transverse with respect to a direction of predetermined tensile stress applied to the extensible and contractible wiring sheet.

FIG. 7(b) illustrates a state in which the slits 55 are formed in the first fixing sheet 53.

Since the direction of the predetermined tensile stress applied to the extensible and contractible wiring sheet is the direction indicated by the left right arrow L in FIG. 7(b), the slits are formed in the direction inclined (direction is not parallel) with respect to this direction. The slits are formed in the first fixing sheet, and thus, the first fixing sheet can also be extended together in the subsequent first extension step.

(First Extension Step)

In the first extension step, the tensile stress is applied to the extensible and contractible wiring sheet and the first fixing sheet.

FIG. 7(c) illustrates a state in which the tensile stress is applied to the extensible and contractible wiring sheet 30 and the first fixing sheet 53.

Since the slits 55 are provided in the first fixing sheet 53, the first fixing sheet 53 can be extended together with the extensible and contractible wiring sheet 30.

The first fixing sheet 53 is provided, and thus, the first extension step can be performed while maintaining a state in which the adhesive layer 40 is not exposed. Accordingly, the work efficiency is excellent.

By this first extension step, the voids are formed at the interface between the conductive particles and the resin forming the extensible and contractible wiring.

(Relaxation Step)

In a relaxation step, the tensile stress applied in the first extension step is relaxed. The state illustrated in the drawing is the same as the state of the extensible and contractible wiring sheet 30 and the first fixing sheet 53 to which the tensile stress is not applied as illustrated in FIG. 7(b).

(Second Extension Step)

In a second extension step, the tensile stress is applied to the extensible and contractible wiring sheet again.

The state illustrated in the drawing is the same as the state of the extensible and contractible wiring sheet 30 and the first fixing sheet 53 to which the tensile stress is applied as illustrated in FIG. 7(c).

(Fixing Step)

In the fixing step, a state in which the tensile stress is applied to the extensible and contractible wiring is fixed by providing the second fixing sheet on the first fixing sheet.

FIG. 7(d) illustrates a state in which the tensile stress is applied to the extensible and contractible wiring 20 is fixed by providing the second fixing sheet 54 on the first fixing sheet 53. The fixing sheet 51 is also provided on the main surface 31 of the extensible and contractible wiring sheet 30.

The second fixing sheet 54 and the fixing sheet 51 are provided, and thus, a state in which the tensile stress applied in the second extension step is applied to the extensible and contractible wiring 20 is fixed.

A thin adhesive layer (not illustrated) is provided at the fixing sheet 51, and the fixing sheet 51 is fixed to the main surface 31 of the extensible and contractible wiring sheet 30. Since this adhesive layer strongly adheres to the fixing sheet 51 side and remains on the fixing sheet 51 side when the fixing sheet 51 is peeled off at the time of use of the extensible and contractible wiring board, this adhesive layer does not remain on a front surface of the extensible and contractible wiring sheet 30.

A thin adhesive layer (not illustrated) is also provided at the second fixing sheet 54, and the second fixing sheet 54 is fixed to the first fixing sheet 53. The fixing between the second fixing sheet 54 and the first fixing sheet 53 may be firmly performed. Since the second fixing sheet 54 and the first fixing sheet 53 are peeled off at once at the time of use of the extensible and contractible wiring board, it is preferable that the second fixing sheet 54 and the first fixing sheet 53 are not peeled off.

The extensible and contractible wiring board obtained in this manner is the same as the extensible and contractible wiring board 3 illustrated in FIG. 5.

Although FIG. 7(d) illustrates a form in which the fixing sheet 51 is provided on the main surface 31 of the extensible and contractible wiring sheet 30, the fixing sheet 51 may not be provided.

EXAMPLES

Hereinafter, examples in which the extensible and contractible wiring board of the present invention is disclosed more specifically will be illustrated. The present invention is not limited to these examples.

An extensible and contractible wiring sheet was prepared by forming a dumbbell type wiring made of a mixture of a metal powder and an elastomer resin in a thermoplastic polyurethane resin as an extensible and contractible resin sheet.

A relationship between strain applied to the extensible and contractible wiring sheet and a resistance value was measured in Example 1 in which the extension step of applying the tensile stress is performed on this extensible and contractible wiring sheet and Comparative Example 1 in which the extension step of applying the tensile stress is not performed. The measurement was performed immediately after the extension step.

Figure 8A:
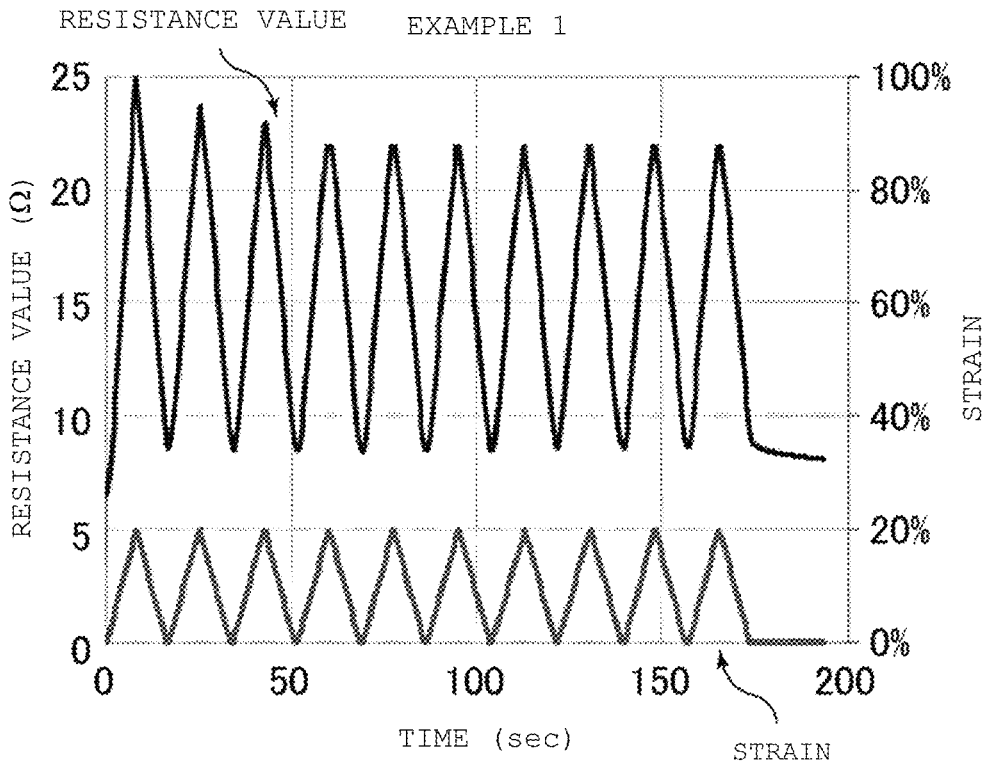
FIG. 8($a$) is a graph showing a relationship between strain, a resistance value, and a time in Example 1, and FIG. 8($b$) is a graph showing a relationship between strain, a resistance value, and a time in Comparative Example 1.
Figure 8B:
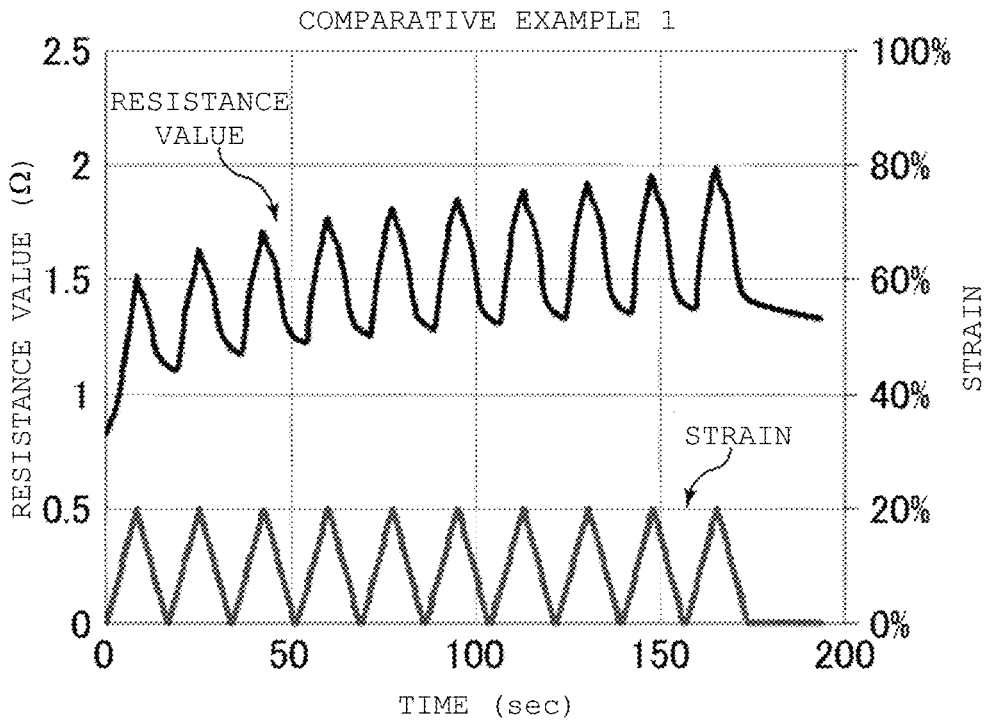

FIG. 8(a) is a graph showing a relationship between the strain, the resistance value, and a time in Example 1, and FIG. 8(b) is a graph showing a relationship between the strain, the resistance value, and a time in Comparative Example 1.

In this test, a change in the resistance value for the strain was measured by repeatedly applying the strain about 3 times in 50 seconds between 0% and −20%.

From this result, it can be seen that the resistance value when the strain is 0% does not change even after the strain is repeatedly applied in Example 1. On the other hand, it can be seen that the resistance value when the strain is 0% increases as the strain is repeatedly applied in Comparative Example 1. That is, zero-drift does not occur in Example 1, and zero-drift occurs in Comparative Example 1.

Figure 9A:
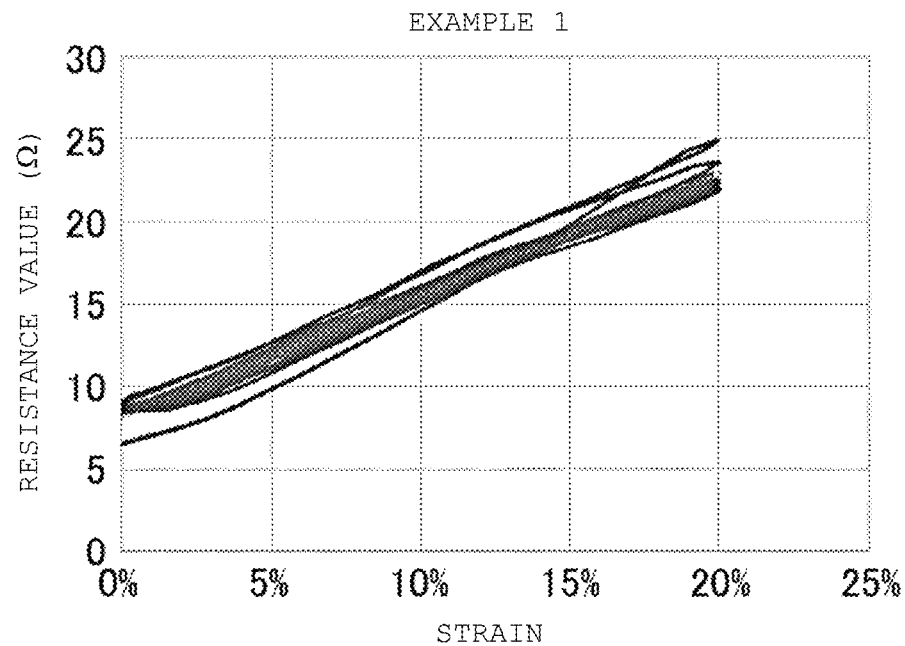
FIG. 9($a$) is a graph showing the relationship between the strain and the resistance value in Example 1, and FIG. 9($b$) is a graph showing the relationship between the strain and the resistance value in Comparative Example 1.
Figure 9B:
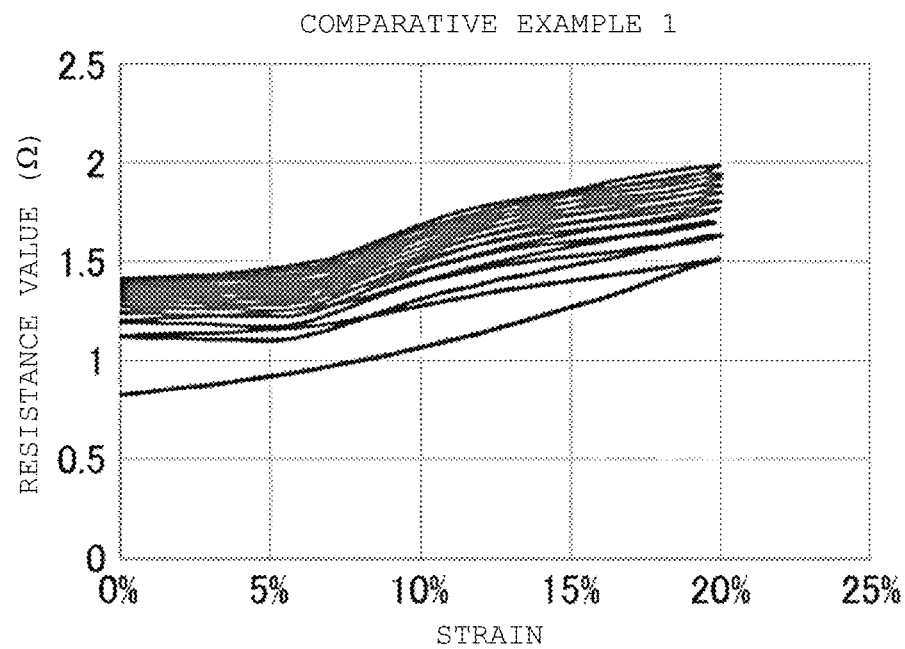

FIG. 9(a) is a graph showing the relationship between the strain and the resistance value in Example 1, and FIG. 9(b) is a graph showing the relationship between the strain and the resistance value in Comparative Example 1.

In this test, the change in the resistance value for the strain was measured while gradually increasing the strain between 0% and −20%. A plurality of lines shows a plurality of results when the test is repeatedly performed.

In Example 1, the resistance value for the strain of 0% is about 7 to 9Ω, and the resistance value for the strain of 20% is about 22 to 25Ω. On the other hand, in Comparative Example 1, the resistance value for the strain of 0% is about 0.8 to 1.4Ω, and the resistance value for the strain of 20% is about 1.5 to 2.0Ω.

Since the amount of change in the resistance differs by about 10 times, it can be seen that Example 1 can be used as a sensor with higher sensitivity. The change in the resistance value for the strain is linear in Example 1, but is not linear and has a slightly S-shaped curve in Comparative Example 1.

Thus, it can be seen that the relationship between the strain and the resistance value is clearer in Example 1 and the performance as a sensor for measuring the strain by the change in the resistance value is high.

Next, test results for confirming an effect of maintaining a state in which the tensile stress is applied to the extensible and contractible wiring after the extension step are shown. Similar to Example 1, Example 2 in which an extensible and contractible wiring sheet obtained by performing the first extension step of applying the tensile stress to the extensible and contractible wiring sheet, performing the second extension step after the relaxation step was performed, and fixing a state in which the tensile stress was applied to the extensible and contractible wiring by the fixing sheet was stored for one day was prepared. Similar to Example 1, Comparative Example 2 in which an extensible and contractible wiring sheet obtained by performing the relaxation step after the first extension step of applying the tensile stress to the extensible and contractible wiring sheet, not performing the second extension step, and further not performing the fixing with the fixing sheet was stored for one day was prepared.

A relationship between strain applied to the extensible and contractible wiring sheet and a resistance value was measured for the extensible and contractible wiring sheets of Example 2 and Comparative Example 2. The extensible and contractible wiring sheet of Example 2 was measured immediately after the fixing sheet was peeled off.

Figure 10A:
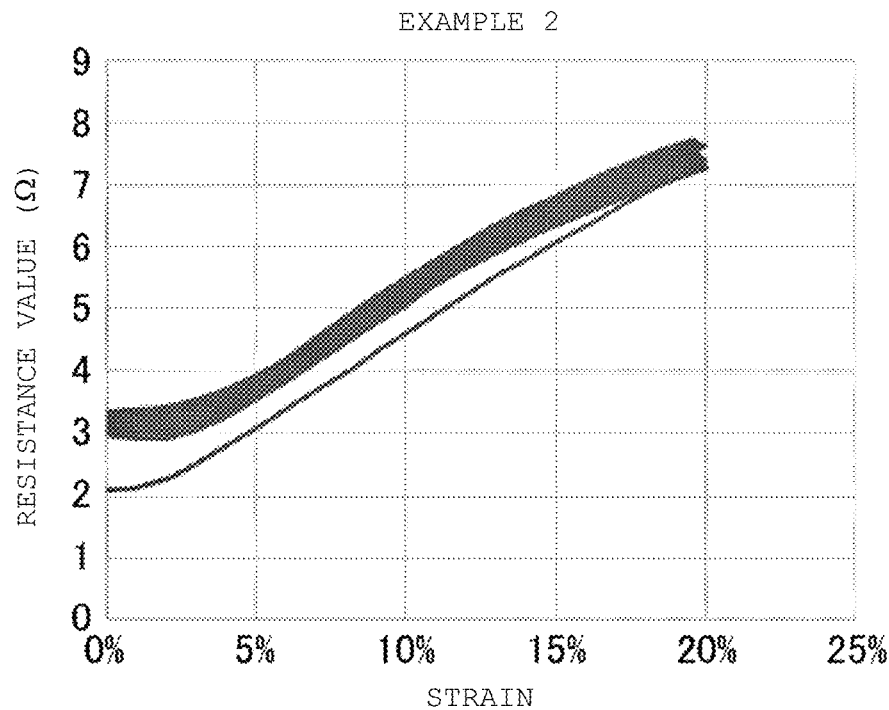
FIG. 10($a$) is a graph showing a relationship between strain and a resistance value of an extensible and contractible wiring sheet of Example 2, and FIG. 10($b$) is a relationship between strain and a resistance value of an extensible and contractible wiring sheet of Comparative Example 2.
Figure 10B:
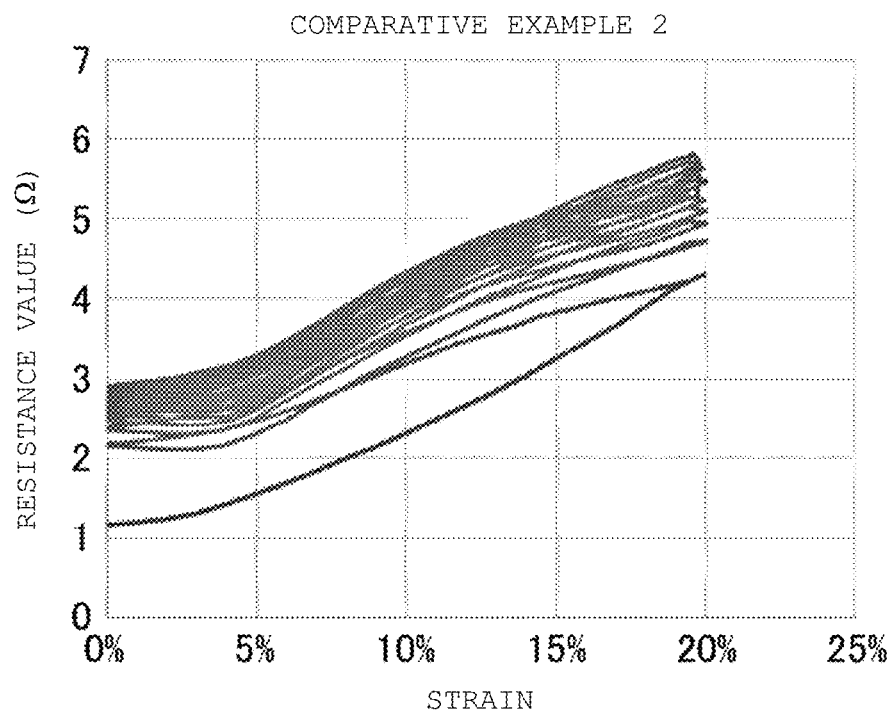

FIG. 10(*a*) is a graph showing the relationship between the strain and the resistance value of the extensible and contractible wiring sheet of Example 2, and FIG. 10(*b*) is the relationship between the strain and the resistance value of the extensible and contractible wiring sheet of Comparative Example 2.

When FIG. 10(*a*) and FIG. 10(*b*) are compared, the extensible and contractible wiring sheet of Example 2 has high linearity of a change in the resistance value for the strain and small variation. The amount of change in the resistance value is also large, and thus, it can be seen that the extensible and contractible wiring sheet of Example 2 can be used as a sensor with high sensitivity.

The extensible and contractible wiring sheet of Comparative Example 2 has low linearity of a change in the resistance value for the strain and has large variation. The amount of change in the resistance value is small, and thus, it can be seen that the sensitivity as the sensor is low.

DESCRIPTION OF REFERENCE SYMBOLS 1, 2, 3: Extensible and contractible wiring board
10: Extensible and contractible resin sheet
20: Extensible and contractible wiring
21: Wiring
22: Electrode
23: Conductive particles
24: resin
25: Void
30: Extensible and contractible wiring sheet
31: Main surface of extensible and contractible wiring sheet (main surface on extensible and contractible wiring side)
32: Main surface of extensible and contractible wiring sheet (main surface not on extensible and contractible wiring side)
40: Adhesive layer
50, 51, 52: Fixing sheet
53: First fixing sheet
54: Second fixing sheet
55: Slit

The invention claimed is:

1. A method for manufacturing an extensible and contractible wiring board, the method comprising:
    applying a first tensile stress to an extensible and contractible wiring sheet that includes an extensible and contractible resin sheet and an extensible and contractible wiring formed on the extensible and contractible resin sheet;
    relaxing the first tensile stress;
    applying a second tensile stress to the extensible and contractible wiring sheet after relaxing the first tensile stress; and
    securing a fixing sheet to a main surface of the extensible and contractible wiring sheet in a state in which the second tensile stress is applied.

2. The method for manufacturing an extensible and contractible wiring board according to claim 1, further comprising providing an adhesive layer on the main surface of the extensible and contractible resin sheet before securing the fixing sheet.

3. The method for manufacturing an extensible and contractible wiring board according to claim 2,
    wherein the fixing sheet is a first fixing sheet and the main surface is a first main surface of the extensible and contractible wiring sheet opposite to a second main surface of the extensible and contractible wiring sheet having the extensible and contractible wiring, and the method further comprises:
    securing a second fixing sheet on the second main surface of the extensible and contractible wiring sheet in a state in which the second tensile stress applied.

4. The method for manufacturing an extensible and contractible wiring board according to claim 1,
    wherein the fixing sheet is a first fixing sheet and the main surface is a first main surface of the extensible and contractible wiring sheet opposite to a second main surface of the extensible and contractible wiring sheet having the extensible and contractible wiring, and the method further comprises:
    securing a second fixing sheet on the second main surface of the extensible and contractible wiring sheet in a state in which the second tensile stress applied.

5. The method for manufacturing an extensible and contractible wiring board according to claim 4, the method further comprising:
    forming a slit in the first fixing sheet in a direction transverse with respect to a direction of the applied first tensile stress before the first tensile stress is applied to the extensible and contractible wiring sheet; and
    securing a third fixing sheet on the first fixing sheet of the extensible and contractible wiring sheet in a state in which the second tensile stress applied.

6. The method for manufacturing an extensible and contractible wiring board according to claim 1,
    wherein the fixing sheet is a first fixing sheet and the main surface is a first main surface of the extensible and contractible wiring sheet opposite to a second main surface of the extensible and contractible wiring sheet having the extensible and contractible wiring, and the method further comprises:

forming a slit in the first fixing sheet in a direction transverse with respect to a direction of the applied first tensile stress before the first tensile stress is applied to the extensible and contractible wiring sheet; and securing a second fixing sheet on the first fixing sheet of the extensible and contractible wiring sheet in a state in which the second tensile stress applied.

7. The method for manufacturing an extensible and contractible wiring board according to claim 6, further comprising providing an adhesive layer on the first main surface of the extensible and contractible resin sheet before securing the first fixing sheet.

8. The method for manufacturing an extensible and contractible wiring board according to claim 7, further comprising securing a third fixing sheet on the second main surface of the extensible and contractible wiring sheet in a state in which the second tensile stress applied.

* * * * *